United States Patent
Tsai et al.

(10) Patent No.: US 11,532,547 B2
(45) Date of Patent: Dec. 20, 2022

(54) INTERCONNECT STRUCTURES WITH LOW-ASPECT-RATIO CONTACT VIAS

(71) Applicant: Taiwan Semiconductor Manufacturing Co., Ltd., Hsinchu (TW)

(72) Inventors: Cheng-Hsiung Tsai, Miaoli County (TW); Ming-Han Lee, Taipei (TW); Chung-Ju Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/547,732

(22) Filed: Aug. 22, 2019

(65) Prior Publication Data
US 2021/0057333 A1    Feb. 25, 2021

(51) Int. Cl.
*H01L 23/522* (2006.01)
*H01L 21/768* (2006.01)
*H01L 23/532* (2006.01)
*H01L 23/528* (2006.01)

(52) U.S. Cl.
CPC .... *H01L 23/5226* (2013.01); *H01L 21/76816* (2013.01); *H01L 21/76831* (2013.01); *H01L 21/76843* (2013.01); *H01L 21/76897* (2013.01); *H01L 23/5283* (2013.01); *H01L 23/53266* (2013.01)

(58) Field of Classification Search
CPC .............. H01L 29/2003; H01L 29/872; H01L 29/66143; H01L 29/66212; H01L 29/0657; H01L 29/0692; H01L 29/0619
See application file for complete search history.

(56) References Cited

U.S. PATENT DOCUMENTS

| | | | | |
|---|---|---|---|---|
| 5,269,880 | A * | 12/1993 | Jolly | H01L 21/02063 148/DIG. 161 |
| 9,520,362 | B2 | 12/2016 | Lin et al. | |
| 9,716,032 | B2 | 7/2017 | Tang et al. | |
| 2005/0250320 | A1* | 11/2005 | Tsai | H01L 21/76856 438/672 |
| 2005/0258484 | A1* | 11/2005 | Itou | H01L 24/05 257/341 |
| 2007/0155157 | A1* | 7/2007 | Chou | H01L 21/76802 438/618 |
| 2009/0227101 | A1* | 9/2009 | Jung | H01L 23/53252 257/E21.585 |
| 2014/0213051 | A1* | 7/2014 | Yu | H01L 23/5329 438/653 |
| 2014/0264920 | A1* | 9/2014 | Yang | H01L 21/76843 257/774 |
| 2016/0379871 | A1* | 12/2016 | Tsai | H01L 21/76885 257/774 |
| 2018/0108607 | A1* | 4/2018 | Farooq | H01L 23/5283 |
| 2019/0096801 | A1* | 3/2019 | Yang | H01L 21/76885 |

* cited by examiner

*Primary Examiner* — Farun Lu
(74) *Attorney, Agent, or Firm* — Haynes and Boone, LLP

(57) ABSTRACT

Interconnect structures and methods of forming the same are provided. An interconnect structure according to the present disclosure includes a first conductive feature in a first dielectric layer, a second conductive feature aligned with and over the first conductive feature, a first insulation layer over the first dielectric layer and the second conductive feature, a second dielectric layer over the first insulating layer, and a contact via through the first insulation layer and the second dielectric layer.

20 Claims, 14 Drawing Sheets

INTERCONNECT STRUCTURES WITH LOW-ASPECT-RATIO CONTACT VIAS

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as interconnect structures become more compact with ever-shrinking IC feature size, contact vias in the intercontact structures can have high aspect ratios. Fabrication of high-aspect-ratio contact vias may be challenging as it requires formation of high-aspect-ratio via openings and metal deposition in such via openings. Defects of contact vias may lead to failures or significant delays in advanced IC technology nodes. Accordingly, although existing contacts have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
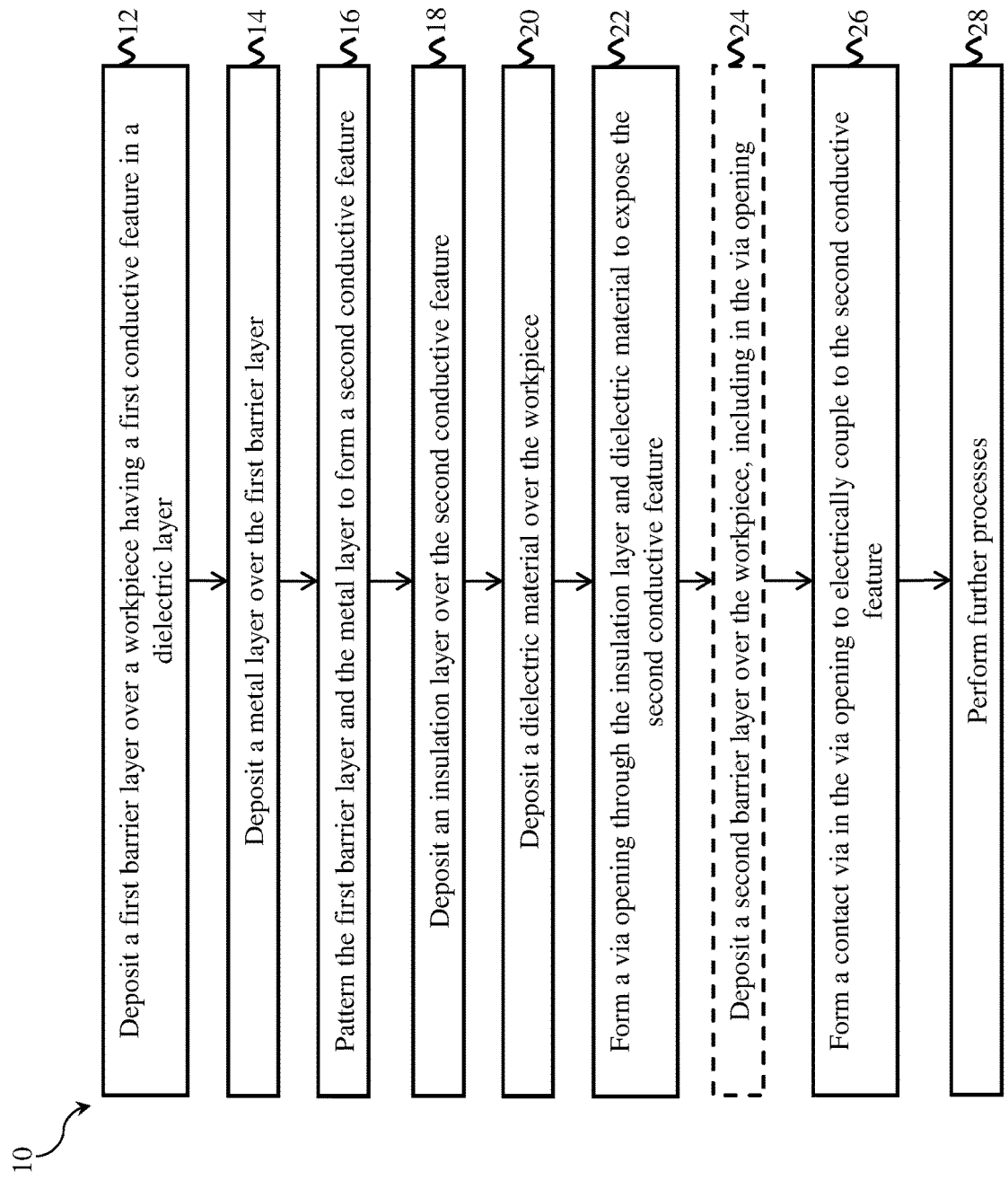
FIG. 1 is a flow chart of a method for fabricating a contact structure of an integrated circuit device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

IC manufacturing process flow is typically divided into three categories: front-end-of-line (FEOL), middle-end-of-line (MEOL), and back-end-of-line (BEOL). FEOL generally encompasses processes related to fabricating IC devices, such as transistors. For example, FEOL processes can include forming isolation features, gate structures, and source and drain features (generally referred to as source/drain features). MEOL generally encompasses processes related to fabricating contacts to conductive features (or conductive regions) of the IC devices, such as contacts to the gate structures and/or the source/drain features. BEOL generally encompasses processes related to fabricating a multilayer interconnect (MLI) feature that interconnects IC features fabricated by FEOL and MEOL (referred to herein as FEOL and MEOL features or structures, respectively), thereby enabling operation of the IC devices.

The present disclosure generally relates to BEOL processes directed at fabricating an MLI structure for planar IC devices and/or non-planar IC devices (for example, fin-like field effect transistors (FinFETs)). An MLI structure may include a plurality of conductive layers. Conventionally, after a first conductive feature is formed in a first dielectric layer, a dual damascene process may be used to form further conductive features, such as metal lines and contact vias, through dielectric layers. When dual damascene processes are used to form interconnect structures of reduced dimensions, the via openings with high aspect ratios have to be etched through the dielectric layers to form high-aspect-ratio contact vias. While the formation of high-aspect-ratio contact vias is viable, it has its own fair share of challenges. Among them, the etching of high-aspect-ratio via openings may cause damages to sidewalls of the via openings, resulting in increase in dielectric constant and parasitic capacitance. In some cases, etching via openings with high aspect ratios can result in wiggly or wavy via openings, further reducing the process window and lowering the yield. In addition, metal fill into the high-aspect-ratio via openings may be difficult and voids in the contact vias may increase resistance. Methods for fabricating an interconnect structure disclosed herein form interconnect structures that include second conductive features formed from reactive ion etch (RIE) of a metal layer and low-aspect-ratio contact vias over the second conductive features. Interconnect structures disclosed herein have thus been observed to provide contact vias with low resistance and reduced parasitic capacitance. Different embodiments may have different advantages, and no particular advantage is required of any embodiment.

FIG. 1 is a flow chart of a method 10 for fabricating an interconnect structure of an integrated circuit (IC) device according to various aspects of the present disclosure. At block 12, a first barrier layer is deposited over a workpiece, which includes a first conductive feature in a dielectric layer.

At block 14, a metal layer is deposited over the first barrier layer. At block 16, the first barrier layer and the metal layer are patterned to form a second conductive feature. At block 18, an insulation layer is deposited over the second conductive feature. At block 20, a dielectric material is deposited over the workpiece. At block 22, a via opening is formed through the insulation layer and the dielectric material to expose the second conductive feature. At block 24, a second barrier layer is optionally deposited over the workpiece, including in the via opening. At block 26, a contact via is formed in the via opening to electrically couple to the second conductive feature. At block 28, further processes are performed. Additional steps can be provided before, during, and after the method 10, and some of the steps described can be replaced or eliminated for other embodiments of the method 10.

Blocks of the method 10 of FIG. 1 may be better described in conjunction with FIGS. 2-7, 8, 9A, 9B, 10A, 10B, 11A, and 11B, which are fragmentary cross-sectional diagrammatic views of a workpiece 100 of an IC device at various fabrication stages of a method, such as method 10 of FIG. 1. The IC device to be formed on workpiece 100 can be included in a microprocessor, a memory, and/or other IC device. In some implementations, workpiece 100 is a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. The transistors may be planar transistors or non-planar transistors, such as fin-like FETs (FinFETs) or gate-all-around (GAA) transistors. FIGS. 2-7, 8, 9A, 9B, 10A, 10B, 11A, and 11B have been simplified for the sake of clarity to better understand the inventive concepts of the present disclosure. Additional features can be added in workpiece 100, and some of the features described below can be replaced, modified, or eliminated in other embodiments of workpiece 100.

Figure 2:
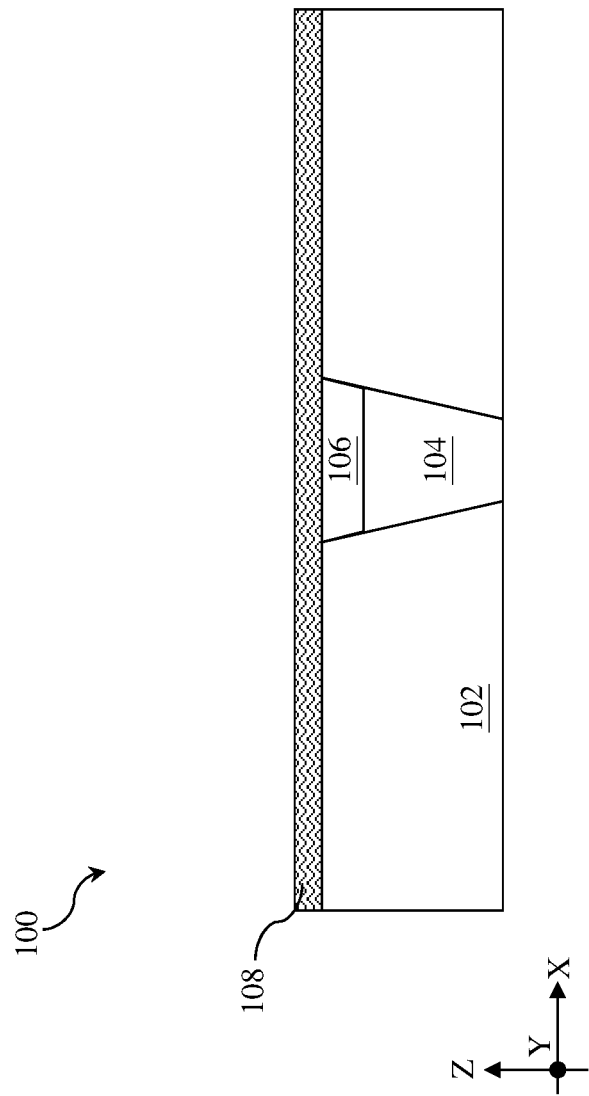
FIGS. 2-7, 8, 9A, 9B, 10A, 10B, 11A, and 11B are fragmentary cross-sectional diagrammatic views of an interconnect structure at various fabrication stages of a method, such as the method of FIG. 1, according to various aspects of the present disclosure.

Reference is made to FIGS. 1 and 2. The method 10 includes block 12 where a first barrier layer 108 is deposited over a workpiece 100, which includes a first conductive feature 104 in a first dielectric layer 102. In some embodiments, a capping layer 106 over the first conductive feature 104. In some embodiments, the first conductive feature 104 may include a first metal, such as copper, cobalt, ruthenium, molybdenum, chromium, tungsten, manganese, rhodium, iridium, nickel, palladium, platinum, silver, gold, aluminum, and a combination thereof. The first dielectric layer 102 may include silicon oxide or other suitable dielectric material. In some instances, the first dielectric layer 102 may be referred to as an interlayer dielectric (ILD) layer. In some embodiments, the capping layer 106 may include a second metal, such as copper, cobalt, ruthenium, molybdenum, chromium, tungsten, manganese, rhodium, iridium, nickel, palladium, platinum, silver, gold, aluminum, and a combination thereof. In one embodiment, the first conductive feature 104 consists essentially of the first metal, the capping layer 106 consists of the second metal, and the first metal is different than the second metal. The capping layer 106 protects the first conductive feature 104 from being etched or damaged in processes taking place after the first conductive feature 104 is formed. In some embodiments, the first barrier layer 108 may be formed of a metal nitride, such as tantalum nitride (TaN) or titanium nitride (TiN). In some implementations, the first barrier layer 108 may be deposited using PVD, CVD, ALD, ECP, ELP to a thickness between about 1 nm and about 10 nm. The first barrier layer 108 goes between the oxygen-containing dielectric layer, such as the first dielectric layer 102, and the metal layer (110, to be described below), to block oxygen diffusion in to the metal layer.

While illustrated in FIGS. 2-7, 8, 9A, 9B, 10A, 10B, 11A, and 11B as a stand-alone feature in the first dielectric layer 102, the first conductive feature 104 may be a gate contact via or a source/drain contact via formed in MEOL processes. Although not shown in FIGS. 2-7, 8, 9A, 9B, 10A, 10B, 11A, and 11B, the first conductive feature 104 may be disposed near another first conductive feature in some instances. In those instances, the first conductive feature 104 may be separated from another first conductive feature 104 by one or more gate spacer layers (or spacers), one or more liners, or one or more air gaps. In some embodiments, the first conductive feature 104 is formed in a self-aligned contact (SAC) dielectric layer that is deposited between one or more spacers.

Figure 3:
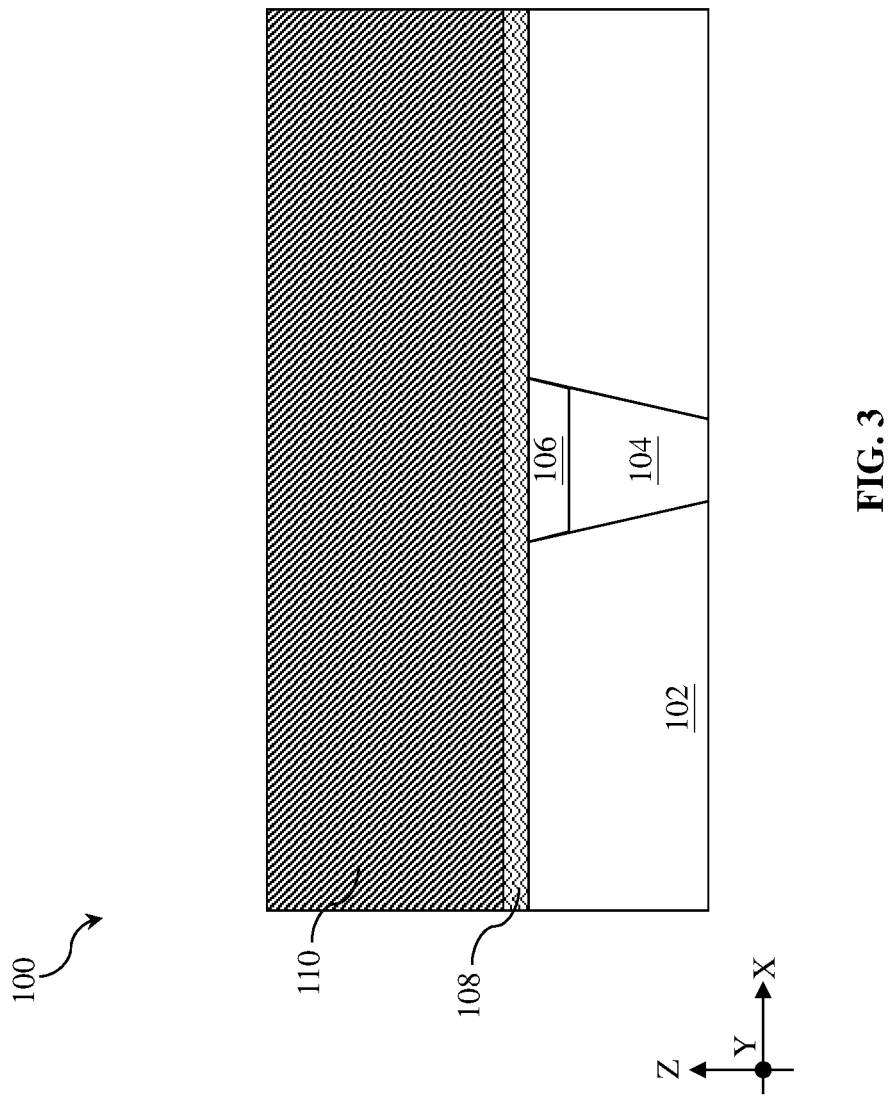

Referring now to FIGS. 1 and 3, the method 10 includes block 14 where a metal layer 110 is deposited over the first barrier layer 108. In some embodiments, the metal layer 110 may include ruthenium, cobalt, iridium, rhodium, copper, a binary compound thereof, or a ternary compound thereof. In some implementations, the metal layer 110 may consist essentially of copper. In some instances, the metal layer 110 may include ruthenium, cobalt, iridium, rhodium and is free of coper. The metal layer 110 may be deposited using physical vapor deposition (PVD), chemical vapor deposition (CVD), atomic layer deposition (ALD), electroplating (ECP), electroless plating (ELP) and may be formed to a thickness between about 10 nm and about 20 nm.

Figure 4:
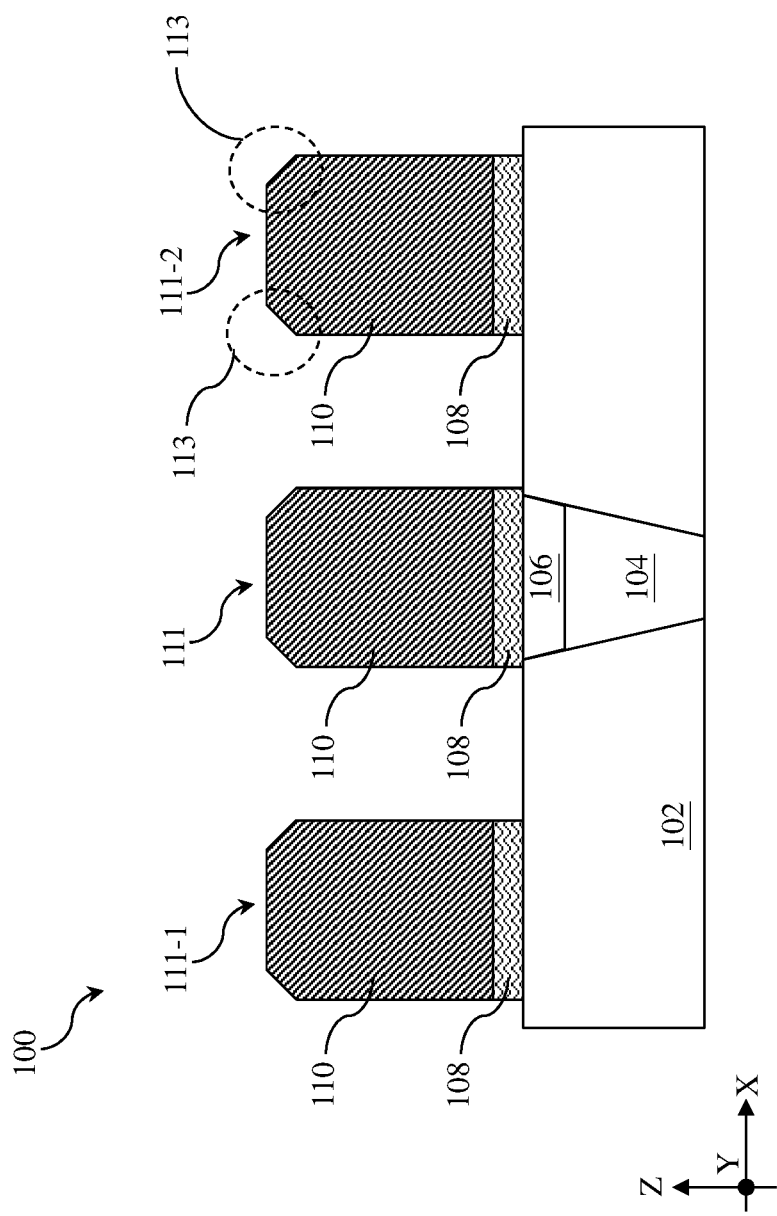

Referring now to FIGS. 1 and 4, the method 10 includes block 16 where the first barrier layer 108 and the metal layer 110 are patterned to form second conductive features 111, 111-1 and 111-2. In some embodiments, the first barrier layer 108 and the metal layer 110 are patterned using photolithography techniques. As an example, a hardmask layer is formed on the metal layer 110. The hardmask layer may be formed from an inorganic material, which may be a semiconductor nitride (such as silicon nitride), a semiconductor oxide (such as silicon oxide or aluminum oxide), the like, or combinations thereof, and may be formed by a deposition process such as CVD, ALD, or the like. In some embodiments, the hardmask layer is a multi-layer structure including a silicon nitride layer and a silicon oxide layer thereon. A photoresist is then formed and patterned on the hardmask layer. The photoresist may be formed by spin coating or the like and may be exposed to radiation reflected off or through a mask for patterning. The pattern of the photoresist corresponds to the second conductive features 111, 111-1 and 111-2. The patterning forms openings through the photoresist. The patterned photoresist is then used in an etching process, such as an anisotropic wet or dry etch, to pattern the hardmask layer, with remaining portions of the hardmask layer forming the second conductive features. The photoresist may then be removed by an acceptable ashing or stripping process, such as using an oxygen plasma or the like. In some implementations, the etching process at block 16 is an RIE process that utilizes a plasma formed from halogen-based reactant gases, such as chlorine ($Cl_2$), tetrafluoromethane ($CF_4$), trifluoromethan ($CHF_3$), hydrochloric acid (HCl), and hydrobromic acid (HBr), or the like. In some of the implementations, argon (Ar), nitrogen ($N_2$) or oxygen ($O_2$) may be used in the RIE process as ion sources.

The etching chemistry may be selected based on the composition of the metal layer 110. In embodiments where the metal layer 110 includes copper, operations at block 16 may be performed without halogen-based reactant gases to prevent copper corrosion. It has been observed that while copper possesses the highest conductivity out of metal selections, copper has poor corrosion resistance when etched with halogen-based chemistry (such as fluorine-based, chlorine-based or bromine-based chemistry) and may exhibit poor conductivity when corroded. Instead, hydrogen, methane, or methanol may be used in the RIE process to prevent copper corrosion. In other embodiments where the metal layer 110 is copper-free and includes ruthenium, cobalt, iridium, rhodium, halogen-based chemistry may be used.

In some instances, the ion energy of the RIE process at block 16 is between about 50 W and about 1000 W, and the pressure of the RIE process is between about 10 mTorr and about 500 mTorr. The etching process at block 16 severs the electrically conductive first barrier layer 108 into separate segments in different second conductive features 111, 111-1 and 111-2 to prevent shorting among different second conductive features. In some embodiments, the temperature of the RIE process at block 16 may be between about 0° C. and about 200° C. The RIE process with high ion energy may result in local heating that has been observed to cause wavy or wiggly shapes of second conductive features 111. Keeping the temperature of the RIE process low (such as 0° C. in the disclosed temperature range) helps prevent local heating and any adverse effect it may have on the second conductive features 111. In some implementations, the workpiece 100 is mounted on and in contact with a chuck and a temperature of the chuck is kept between about 0° C. and about 200° C. to help prevent local heating during the RIE process.

In some embodiments represented in FIG. 4, top edges 113 of the second conductive features 111, 111-1 and 111-2 may be rounded or chamfered in the etch process at block 16 of the method 10, despite the use of a hardmask. These rounded or chamfered top edges are characteristics of the second conductive features that are formed from etching of a deposited metal layer. A conductive feature formed using dual damascene processes, such as the first conductive feature 104, does not have top edges like the rounded or chamfered top edges 113 shown in FIG. 4. In addition, each of the second conductive features 111, 111-1 and 111-2 may function as a conductive line. When viewed along the Y direction as illustrated in FIG. 4, the second conductive features 111, 111-1 and 111-2 may appear to have substantially similar shapes and only the second conductive feature 111 in the middle is electrically coupled to the first conductive feature 104. However, each of the second conductive feature 111, 111-1 and 111-2 may span different distances along the Y direction and be electrically coupled to another first conductive features that are not shown in the cross-section illustrated in FIG. 4.

Figure 5:
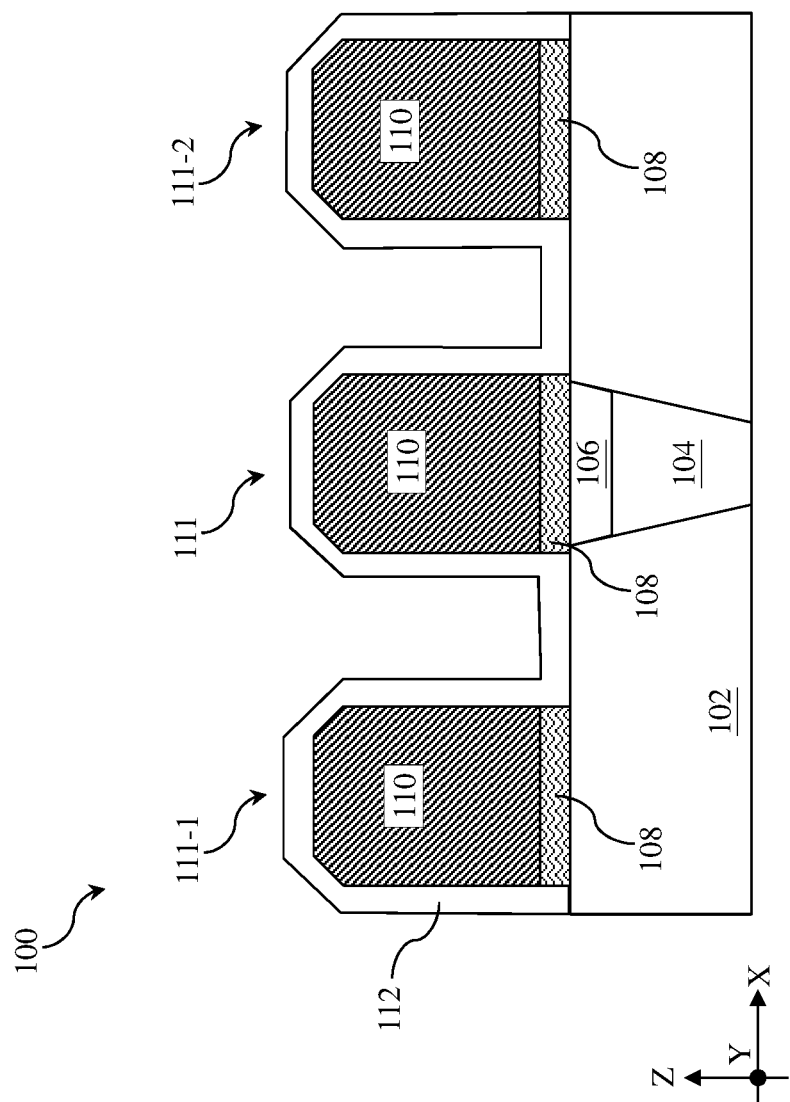

Reference is now made to FIGS. 1 and 5. The method 10 of the present disclosure includes block 18 where an insulation layer 112 is deposited over the second conductive features 111, 111-1 and 111-2. In some embodiments, the insulation layer 112 may be formed of an insulating dielectric layer such as silicon carbonitride, silicon oxycarbide, aluminum oxide, or aluminum nitride. In some other embodiments, the insulation layer 112 may be formed of dielectric material that is free of oxygen to prevent oxidation of the metal layer 110 due to contact with the insulation layer 112. In those embodiments, the insulation layer 112 may be formed of an insulative nitride material, such as aluminum nitride, silicon nitride, silicon carbonitride, or a combination thereof. In some embodiments, the insulation layer 112 is insulative and may be in direct contact with more than one second conductive features 111, 111-1 and 111-2 without electrically coupling them. In some instances where the insulation layer 112 is formed of an insulative nitride material, a metal nitride layer may be formed at the interface between the metal layer 110 and the insulation layer 112 due to any heat treatment that takes place after the deposition of the insulation layer 112 over the metal layer 110. The insulation layer 112 may be deposited using CVD or ALD to a thickness between about 1 Angstrom (Å) and about 10 Å. In some instances, the insulation layer 112 has a thickness less than 5 Å.

Figure 6:
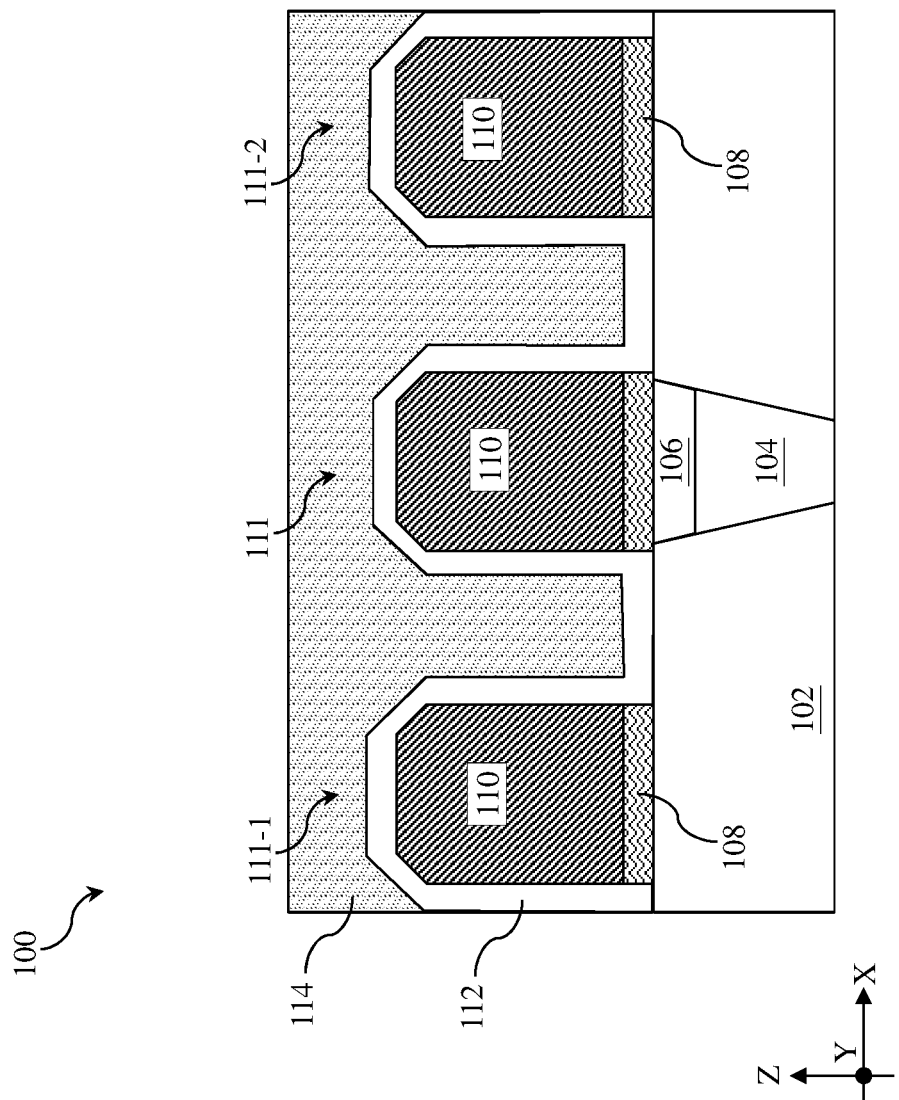

Referring now to FIGS. 1 and 6, the method 10 includes block 20 where a dielectric material is deposited over the workpiece 100 to form the second dielectric layer 114. In some embodiments, the dielectric material is a flowable low-k dielectric material and may be deposited using, for example, spin-on coating or flowable CVD (FCVD) techniques. In some embodiments, the dielectric material may include silicon oxide, silicon nitride, silicon oxynitride, silicon oxycarbide, silicon oxycarbonitride, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. In some implementations, the operations of block 20 may include an anneal step to remove certain functional groups, such as certain hydrocarbon groups, in the deposited dielectric material to make the second dielectric layer 114 porous and have a smaller dielectric constant. In some embodiments, the second dielectric layer 114 has a composition different from the first dielectric layer 102 and may be another ILD layer. In addition, in some implementations, the workpiece 100 may be planarized using, for example, chemical mechanical polishing (CMP), before the method 10 proceeds to block 22. The second conductive feature 111 is electrically coupled to the first conductive feature 104 via the capping layer 106.

Figure 7:
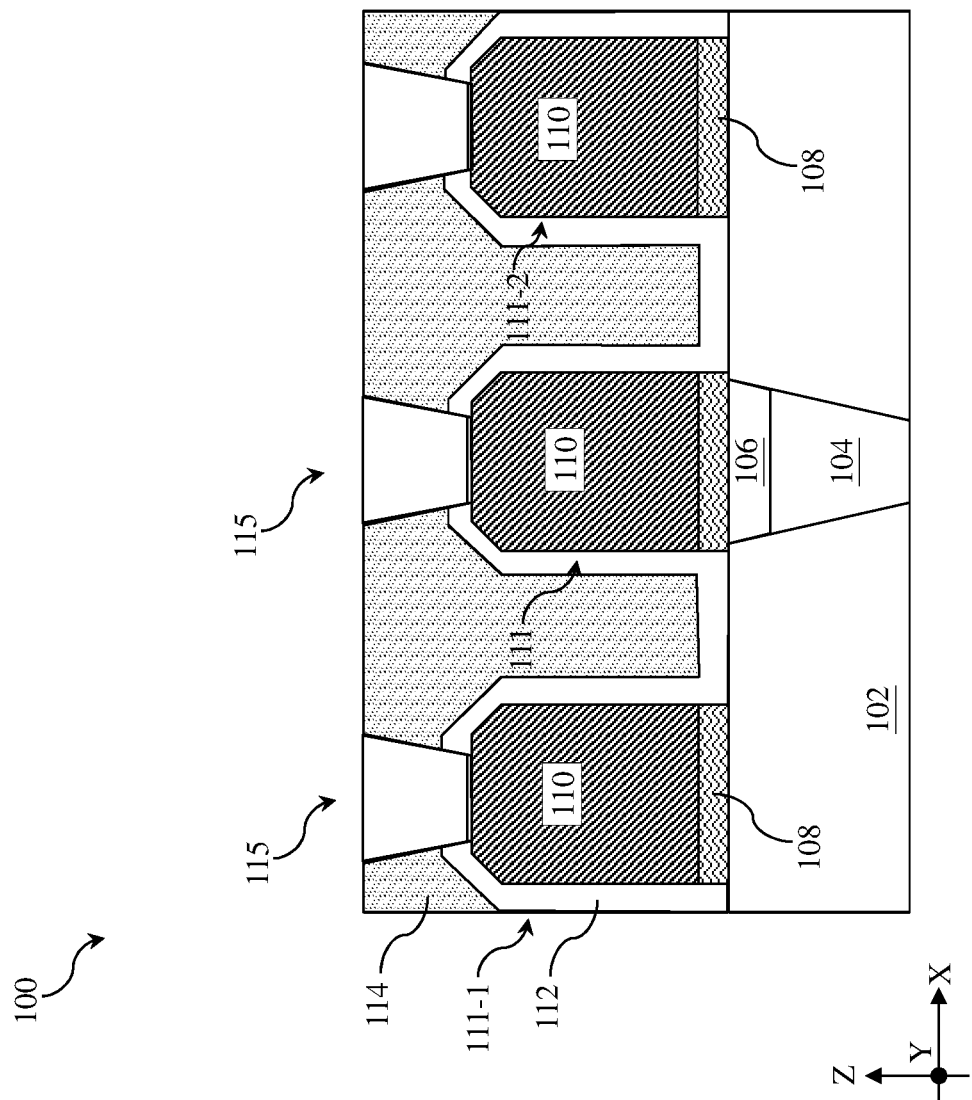

Reference is now made to FIGS. 1 and 7. The method 10 of the present disclosure proceeds to block 22 where a via opening 115 is formed through the insulation layer 112 and the second dielectric layer 114 to expose the second conductive feature 111. In some embodiments, block 22 may use wet etch, dry etch, or a suitable etch technique to etch the insulation layer 112 and the second dielectric layer 114. In some implementations, the etch rate of the insulation layer 112 is smaller than the etch rate of the second dielectric layer 114 and the insulation layer 112 may serve as an etch stop layer (ESL) of the etch operations at block 22. In embodiments represented in FIG. 7, top surfaces of the metal layer 110 in each of the second conductive feature 111 are exposed in the via openings 115. In some implementations, the etch of the second dielectric layer 114 and the etch of the insulation layer 112 are performed using different etch processes. For example, a dry etch technique may be used to etch the second dielectric layer 114 and a wert etch technique may be used to etch the insulation layer 112.

Figure 8:
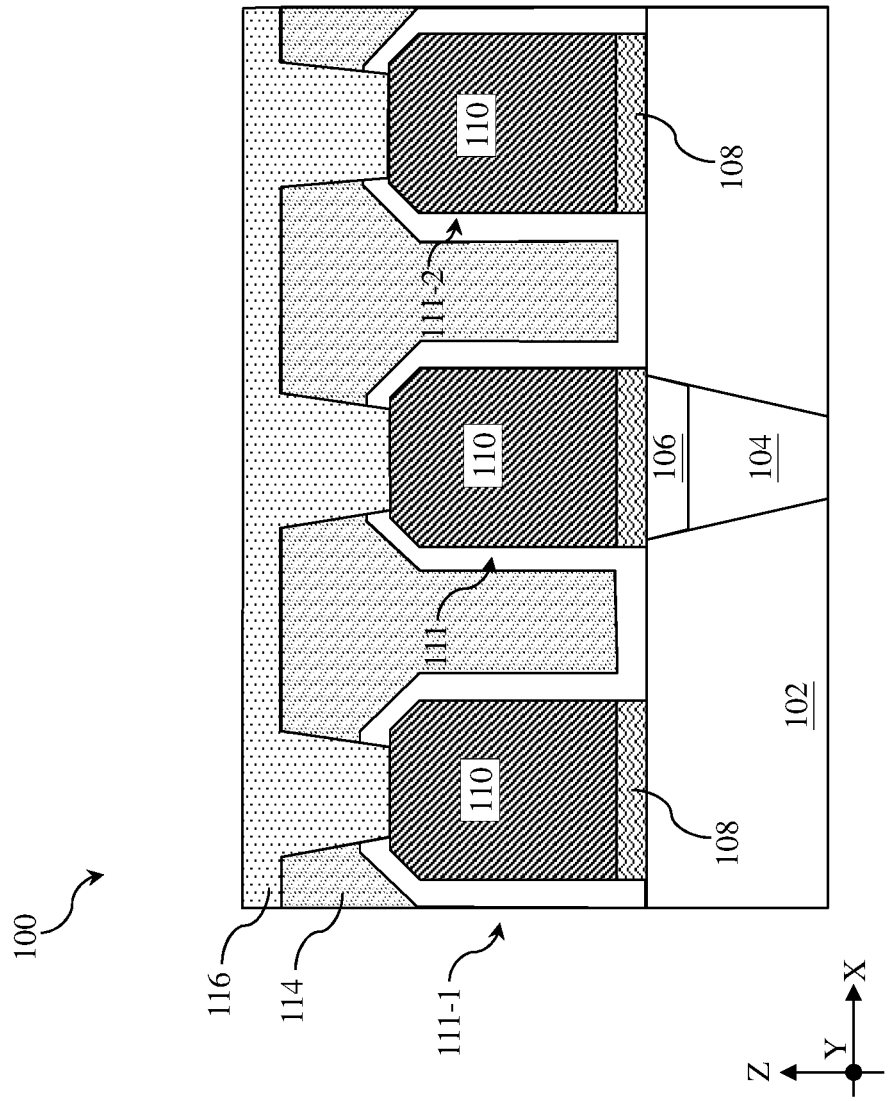

Referring now to FIGS. 1 and 8, the method 10 of the present disclosure may optionally include block 24 where a second barrier layer 116 is optionally deposited over the workpiece 100, including in the via opening 115. In some embodiments, the second barrier layer 116, like the first barrier layer 108, may be formed of a metal nitride, such as tantalum nitride (TaN) or titanium nitride (TiN). In some implementations, the second barrier layer 116 may be deposited using PVD, CVD, ALD, ECP, ELP to a thickness between about 1 nm and about 10 nm. The second barrier layer 116 goes between the oxygen-containing dielectric layer, such as the second dielectric layer 114, and the contact via (118, to be described below), to block oxygen diffusion in to the metal layer.

Figure 9A:
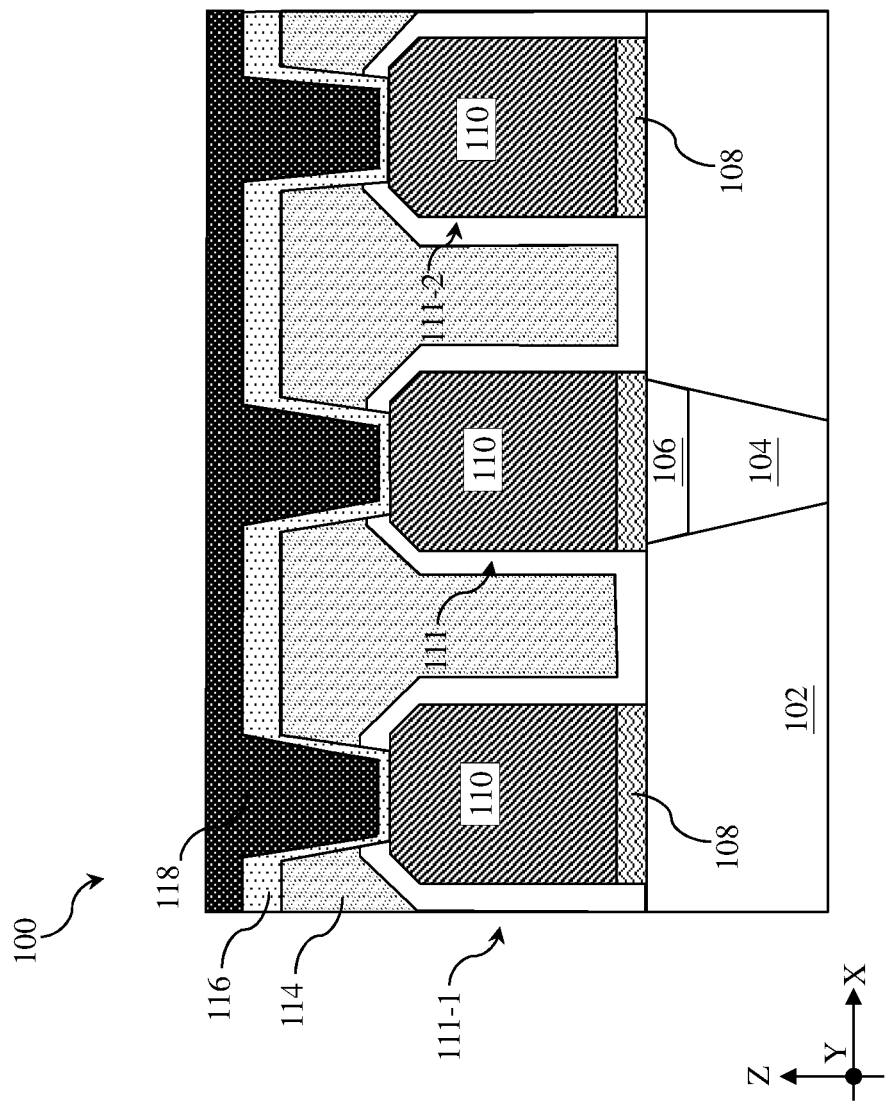
Figure 9B:
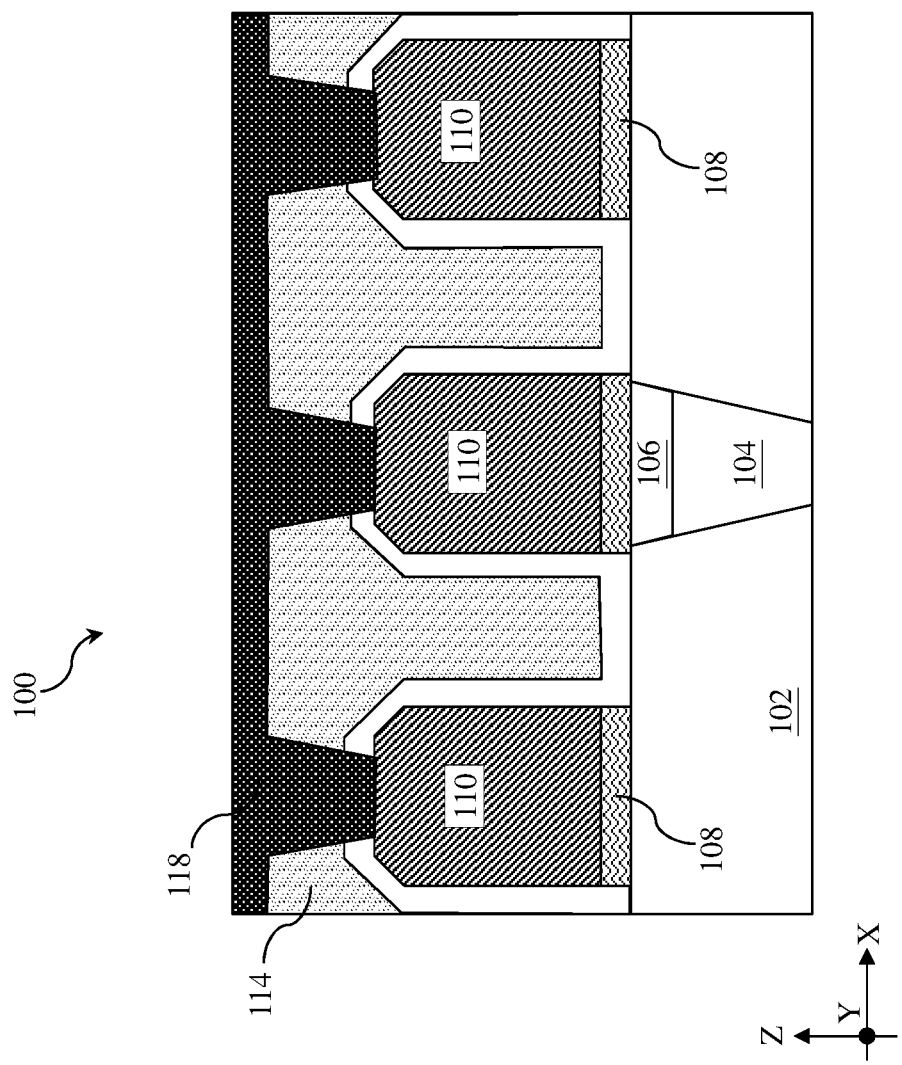

Referring now to FIGS. 1, 9A and 9B, the method 10 of the present disclosure includes block 26 where a contact via 118 is formed in the via opening 115 to electrically couple to the second conductive feature 111, 111-1 or 111-2. In some embodiments, the contact via 118 may include ruthenium, cobalt, iridium, rhodium, copper, tungsten a binary compound thereof, or a ternary compound thereof. In some implementations, the material for the contact via 118 may be deposited using CVD, ALD, or ELP, and may be formed to a thickness between about 1 nm and about 10 nm. In this regard, CVD, ALD and ELP processes are used because of their capability to form the contact via 118 by selectively depositing on the exposed top surfaces of the metal layer 110 and building the thickness of the contact via 118 in a bottom-up manner. This bottom-up formation of the contact via 118 may avoid void formation and ensure quality of the contact via 118. In some alternative embodiments, a seed layer may be first deposited using ECP or PVD and the rest of the contact via 118 may be formed in a bottom-up manner using CVD, ALD, or ELP. In the embodiments illustrated in FIG. 9A, the second barrier layer 116 is disposed between the contact via 118, on the one hand, and the metal layer 110 in the second conductive features 111, 111-1 and 111-2, the insulation layer 112, and the second dielectric layer 114, on the other. In those embodiments, the second barrier layer 116 protects the contact via 118 from oxygen diffusion from the insulation layer 112 and the second dielectric layer 114. In addition, in these embodiments, the second barrier layer 116 and the contact via 118 may be collectively referred to as a contact via and the contact via 118 over the second barrier layer 116 may be referred to as the via plug 118, in order to differentiate from the contact via 118 in the embodiments in FIG. 9B. In the barrier-less embodiments illustrated in FIG. 9B, the contact via 118 is in direct contact with the metal layer 110 in the second conductive features 111, 111-1 and 111-2, the insulation layer 112, and the second dielectric layer 114. In those embodiments, the material of the contact via 118 is selected such that the contact via 118 is less susceptible to oxidation due to oxygen diffusion from the insulation layer 112 and the second dielectric layer 114. For example, the contact via 118 may be formed of tungsten, which is less susceptible to oxidation.

Figure 10A:
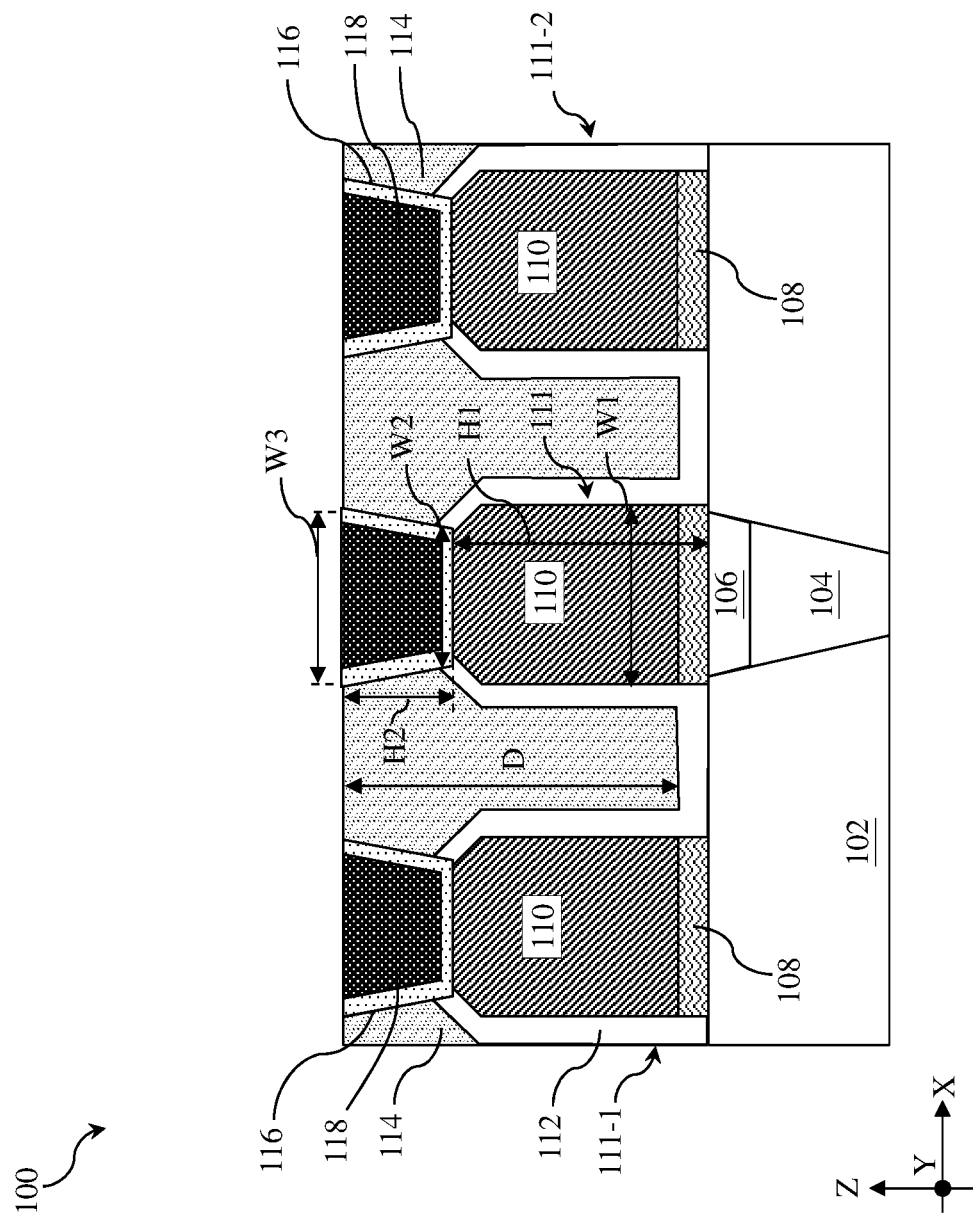
Figure 10B:
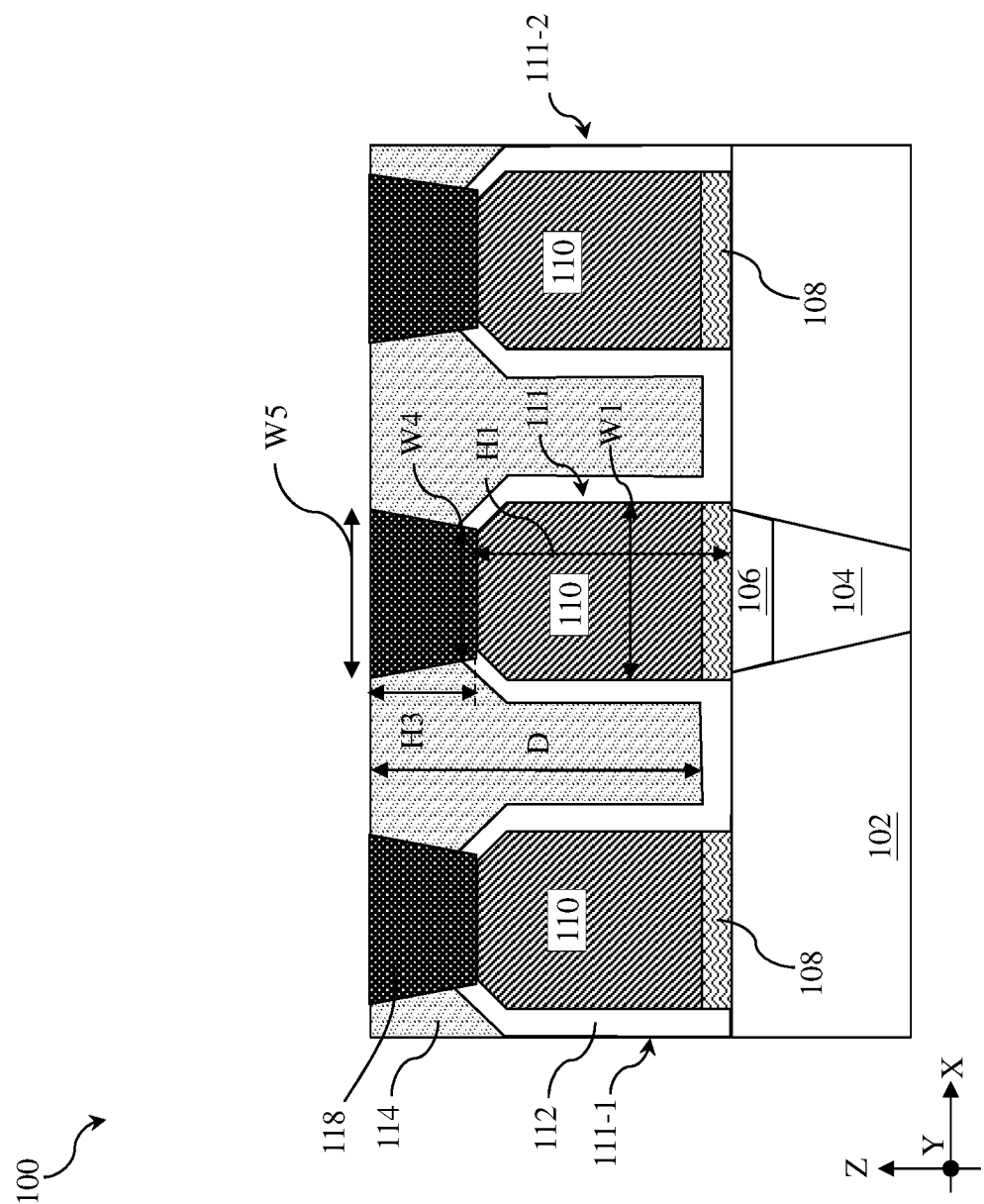
Figure 11A:
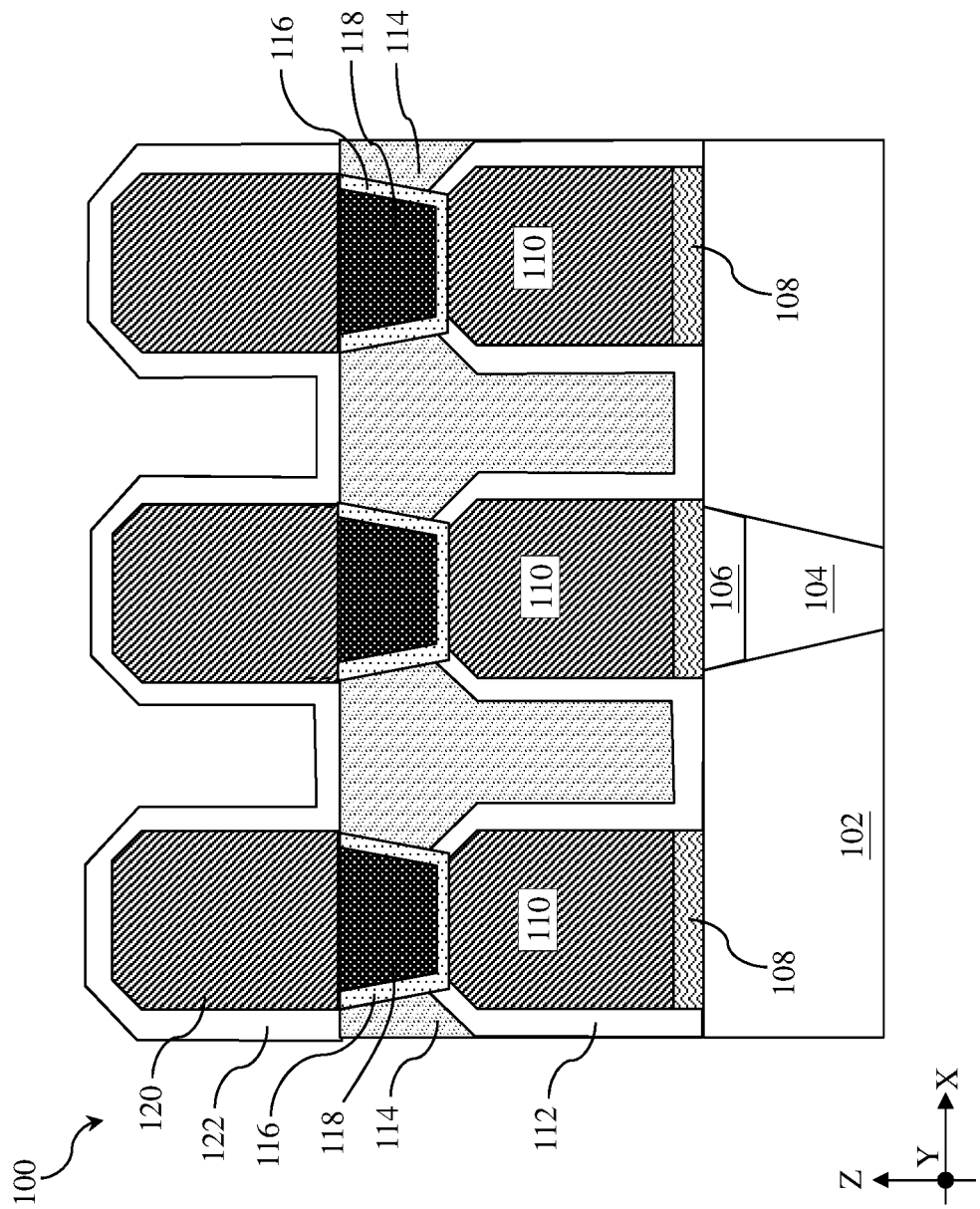
Figure 11B:
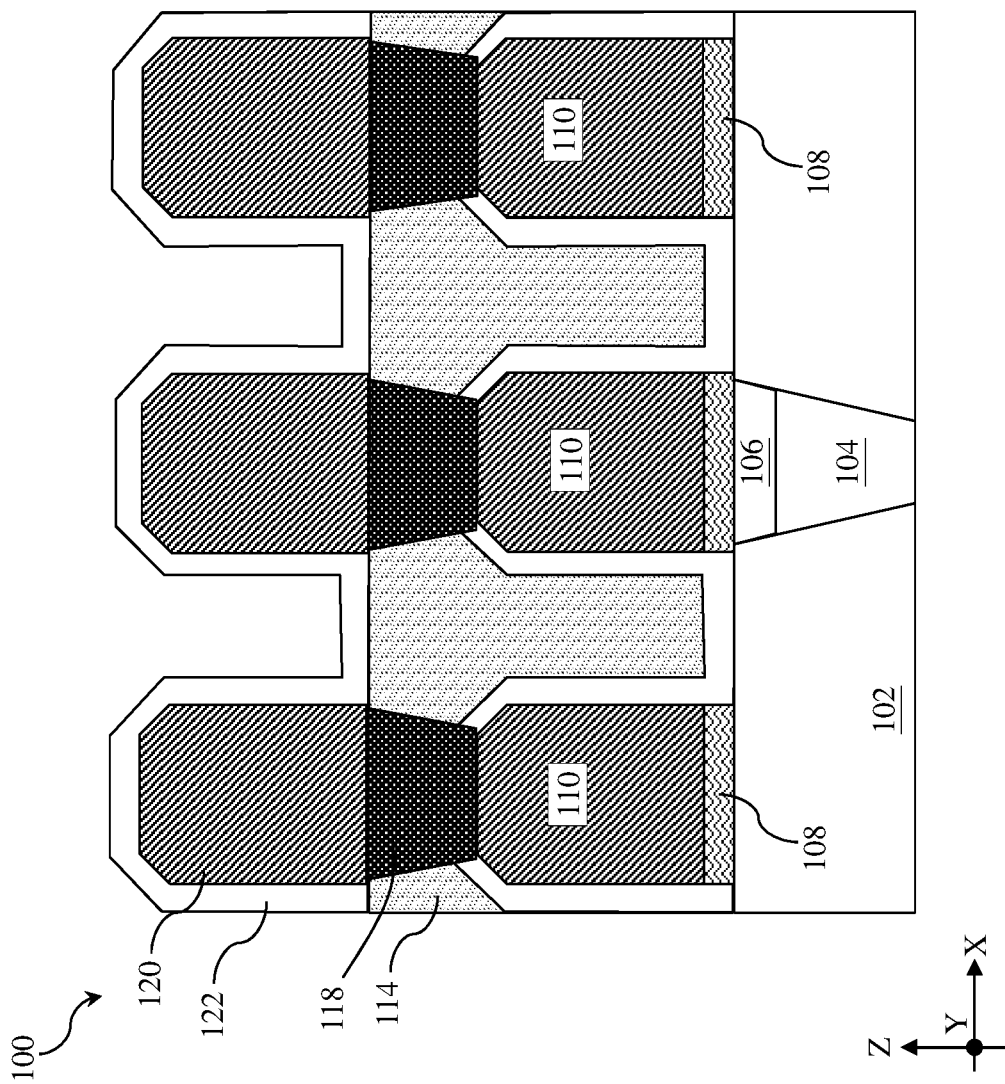

Referring now to FIGS. 1, 10A, 10B, 11A, and 11B, the method 10 of the present disclosure may include block 28 where further processes may be performed. Reference is first made to FIGS. 10A and 10B. In some instances, excess materials for the contact via 118 and the second barrier layer 116 over the top surfaces of the second dielectric layer 114 may be removed by a planarization process, such as CMP, such that the top surfaces of the second dielectric layer 114, the second barrier layer 116, and the contact via 118 are coplanar. The planarization process also severs electrical communication among different contact vias that are coupled to different second conductive features 111, 111-1 and 111-2. As shown in FIG. 10A, each of the second conductive features 111, 111-1 and 111-2 is in direct contact with the first barrier layer 108, the insulation layer 112 and the second barrier layer 116. Because the first barrier layer 108 is conductive, different portions of the first barrier layer 108 in contact with different second conductive features (111, 111-1, 111-2) need to be severed to prevent shorting between different second conductive features. For the same reason, different portions of the second barrier layer 116 in contact with different second conductive features (111, 111-1, 111-2) need to be severed as well. The insulation layer 112 is insulative and may extend from one second conductive feature to another without any concern of shorting. In FIGS. 10A and 10B, the insulation layer 112 extend continuously from over the second conductive feature 111-1, to over the first dielectric layer 102, to over the second conductive feature 111, to over the first dielectric layer 102 again, and then to over the second conductive feature 111-2.

Additional interconnect structures may be formed over and electrically coupled to the contact vias 118. For examples, operations in blocks 12, 14, 16, 18, and 20 of the method 10 may be repeated to form another interconnect layer. In the embodiments represented in FIGS. 11A and 11B, operations in blocks 14, 16 and 18 are repeated to form third conductive features 120 lined and covered by another insulation layer 122. In those embodiments, because the third conductive features 120 are substantially aligned with and coterminous with the contact vias 118 along the X direction, another barrier layer is omitted. In alternative embodiments, another barrier layer may be formed to prevent oxidation of the third conductive features 120 due to contact with the second dielectric layer 114. Still further operations may be performed to complete the fabrication of the IC device. For example, operations similar to those in blocks 20, 22, 24, and 26 may be performed to form contact vias coupled to the third conductive features 120.

Reference is now made to FIG. 10A. In some embodiments, the second conductive feature 111 has a first height H1 along the Z direction and a first width W1 along the X direction. The contact via 118, along with the second barrier layer 116, has a second height H2 along the Z direction, a second width W2 at the bottom surface along the X direction, and a third width W3 at the top surface along the X direction. Except for the top edges that may be chamfered or rounded, the second conductive feature 111 has substantially vertical sidewalls and the first width W1 is substantially uniform along its height H1. The contact via 118 is tapered, with the third width W3 greater than the second width W2. In some implementations, H1 is greater than H2, W1 is greater than W2, W3 is greater than W2, and W1 is substantially equal to W3. The tapering of the contact via 118 may increase the process window or tolerance for the contact via 118 to land on the second conductive feature 111, thereby increasing yield. In some instances, a ratio of first height H1 to the second height H2 (H1:H2) is between about 2:1 and about 4:1.

Reference is now made to FIG. 10B. In some embodiments, the second conductive feature 111 has a first height H1 along the Z direction and a first width W1 along the X direction. The contact via 118 alone has a second height H3 along the Z direction, a fourth width W4 at the bottom surface along the X direction, and a fifth width W5 at the top surface along the X direction. Except for the top edges, the second conductive feature 111 has substantially vertical sidewalls and the first width W1 is substantially uniform along its height H1. The contact via 118 is tapered, with W5 greater than W4. The tapering of the contact via 118 may increase the process window or tolerance for the contact via 118 to land on the second conductive feature 111, thereby increasing yield. In some implementations, H1 is greater than H3, W1 is greater than W4, W5 is greater than W4, and W1 is substantially equal to W5. In some instances, a ratio of first height H1 to the third height H3 (H1:H3) is between about 2:1 and about 4:1.

Embodiments of the present disclosure provide advantages. Reference is now made to FIGS. 10A and 10B. The present disclosure provides methods of forming metal lines (i.e. second conductive features 111) first and then forming contact vias through the second dielectric layer 114 deposited over the metal lines. That is, instead of forming trenches for metal lines and via openings for contact vias through a total depth D (where D equals H1 plus H2 in FIG. 10A or H1 plus H3 in FIG. 10B) of the second dielectric layer 114, the contact via 118 in FIGS. 10A and 10B is only formed through a depth about H2 or H3 through the second dielectric layer 114. Forming the contact via 118 for a much smaller depth H2 or H3 (rather than the depth D) through the second dielectric layer 114 may result in less damage to the sidewalls of the trench/via opening and therefore less increase in parasitic capacitance. In addition, filling the trenches and via openings with a metal fill layer to form the metal lines and contact vias 118 may be difficult because the metal fill layer may accumulate near the top opening, close the top opening, and form voids or air gaps in the resulting metal lines and contact visa, causing an increase in resistance. By reducing the vertical height of the contact via from D to H2 or H3, the problems of increased dielectric constant in the second dielectric layer 114 or increased resistance in the contact via may be prevented or alleviated. Different embodiments may have different advantages, and no particular advantage is required of any embodiment.

The present disclosure provides for many different embodiments. In one embodiment, an interconnect structure is provided. The interconnect structure includes a first conductive feature in a first dielectric layer, a second conductive feature aligned with and over the first conductive feature, a first insulation layer over the first dielectric layer and the second conductive feature, a second dielectric layer over the first insulating layer, and a contact via through the first insulation layer and the second dielectric layer.

In some embodiments, the second conductive feature includes a first barrier layer and a first metal layer over the first barrier layer. In some implementations, the contact via includes a second barrier layer and a via plug. In some instances, the first insulation layer is in direct contact with the first dielectric layer. In some embodiments, the interconnect structure may include a third conductive feature in the first dielectric layer, a fourth conductive feature aligned with and over the third conductive feature, and the first insulation layer over and in contact with the fourth conductive feature. In some implementations, a dielectric constant of the first insulation layer is greater than a dielectric constant of the second dielectric layer. In some instances, the second conductive feature includes a first width throughout a height of the second conductive feature, the contact via includes a top width at a top surface thereof and a bottom width at a bottom surface thereof, the top width is greater than the bottom width, and the first width is greater than the bottom width.

In another embodiment, an interconnect structure is provided. The interconnect structure includes a first conductive feature, a contact via over and in contact with the first conductive feature, a dielectric layer surrounding the first conductive feature and the contact via, and an insulation layer between sidewalls of the first conductive feature and the dielectric layer. The insulation layer does not completely cover sidewalls of the contact via.

In some embodiments, the interconnect structure further includes a second conductive feature adjacent the first conductive feature and the insulation layer is in direct contact with the second conductive feature. In some implementations, the first conductive feature comprises a first barrier layer and a metal layer, and the first barrier layer and the metal layer are in contact with the insulating layer. In some embodiments, the contact via is in contact with the dielectric layer. In some implementations, the contact via includes a second barrier layer and a via plug over the second barrier layer. In some instances, the second barrier layer is disposed between the via plug and the dielectric layer. In some embodiments, top edges of the first conductive feature are chamfered.

In still another embodiment, a method is provided. The method includes providing a workpiece including a first conductive feature in a first dielectric layer; depositing a first barrier layer over the workpiece, depositing a first metal layer over the first barrier layer; patterning the first barrier layer and the first metal layer to form a second conductive feature electrically coupled to the first conductive feature, and a third conductive feature; depositing a first insulation layer over and in contact with the second and third conductive features; depositing a second dielectric layer over the workpiece; forming a via opening through the second dielectric layer and the first insulation layer to expose the second conductive feature; and forming a contact via in the via opening.

In some embodiments, the patterning of the first barrier layer and the first metal layer includes etching the first barrier layer and the first metal layer using a reactive ion etch (RIE) process, the first metal layer consists essentially of coper, and the RIE process includes use of hydrogen, methane, or methanol. In some other embodiments, the patterning of the first barrier layer and the first metal layer comprises etching the first barrier layer and the first metal layer using a reactive ion etch (RIE) process, the first metal layer is free of copper, and the RIE process includes use of halogen-based reactant gases. In some implementations, the forming of the contact via includes depositing a second barrier layer over the second dielectric layer and in the via opening; depositing a third metal layer over the second barrier layer to form a via plug; and planarizing the third metal layer and the second barrier layer such that top surfaces of the third metal layer and the second dielectric layer are coplanar. The planarizing removes the third metal layer over the second dielectric layer. In some instances, the depositing of the second dielectric layer includes depositing a flowable low-k material using spin-on coating. In some embodiments, the first barrier layer includes tantalum nitride or titanium nitride and the first insulation layer includes aluminum nitride, silicon nitride, or silicon carbonitride.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interconnect structure comprising:
a first conductive feature in a first dielectric layer;
a second conductive feature aligned with and over the first conductive feature along a vertical direction;
a first insulation layer over the first dielectric layer and the second conductive feature;
a second dielectric layer over the first insulating layer;
a contact via through the first insulation layer and the second dielectric layer, the contact via comprising a top width at a top surface along a width direction; and
a third conductive feature on the contact via, the third conductive feature comprising a lower width along the width direction,
wherein the second conductive feature comprises ruthenium, cobalt, iridium, or rhodium,
wherein the contact via is coterminous with the third conductive feature along the width direction such that the top width is substantially identical to the lower width,
wherein the second conductive feature comprises a first height along the vertical direction and the contact via comprises a second height along the vertical direction,
wherein the first height is greater than the second height,
wherein a ratio of the first height to the second height is between about 2:1 and about 4:1.

2. The interconnect structure of claim 1,
wherein the second conductive feature comprises a first barrier layer and a first metal layer over the first barrier layer,
wherein the second conductive feature is free of copper.

3. The interconnect structure of claim 2,
wherein the contact via comprises a second barrier layer and a via plug,
wherein top surfaces of the second barrier layer and the via plug are in direct contact with the third conductive feature.

4. The interconnect structure of claim 2, wherein the first insulation layer is in direct contact with the first dielectric layer.

5. The interconnect structure of claim 3,
wherein the third conductive feature is barrier-free and in direct contact with the second barrier layer and the via plug.

6. The interconnect structure of claim 1, wherein a dielectric constant of the first insulation layer is greater than a dielectric constant of the second dielectric layer.

7. The interconnect structure of claim 1,
wherein the second conductive feature includes, along the width direction, a first width at a top surface of the second conductive feature and a second width at a bottom surface of the second conductive feature,
wherein the contact via further includes a bottom width at a bottom surface thereof along the width direction,
wherein the top width is greater than the bottom width,
wherein the second width is greater than the bottom width,
wherein the second width is greater than the first width.

8. An interconnect structure comprising:
a first conductive feature;
a contact via over and in contact with the first conductive feature, the contact via comprising a top width along a direction;
a dielectric layer surrounding the first conductive feature and the contact via; and
an insulation layer between sidewalls of the first conductive feature and the dielectric layer; and
a second conductive feature on the contact via, the second conductive feature comprising a bottom width along the direction,
wherein the first conductive feature comprises ruthenium, cobalt, iridium, or rhodium,
wherein the insulation layer does not completely cover sidewalls of the contact via,
wherein the contact via is coterminous with the second conductive feature along the direction such that the top width is substantially identical to the bottom width
wherein the first conductive feature comprises a first height along a vertical direction perpendicular to the direction and the contact via comprises a second height along the vertical direction,
wherein a ratio of the first height to the second height is between about 2:1 and about 4:1.

9. The interconnect structure of claim 8,
wherein the first conductive feature is free of copper,
wherein the insulating layer comprises an insulative nitride material.

10. The interconnect structure of claim 8,
wherein the first conductive feature comprises a first barrier layer and a metal layer,
wherein the first barrier layer and the metal layer are in contact with the insulating layer.

11. The interconnect structure of claim 8, wherein the contact via is in contact with the dielectric layer.

12. The interconnect structure of claim 10,
wherein the contact via comprises a second barrier layer and a via plug over the second barrier layer,
wherein the second conductive feature is in direct physical contact with top surfaces of the second barrier layer and the via plug.

13. The interconnect structure of claim 12, wherein the second barrier layer is disposed between the via plug and the dielectric layer.

14. The interconnect structure of claim 8, wherein top edges of the first conductive feature are chamfered and the contact via tapers downward such that the first conductive feature and the contact via are narrowest along the direction at an interface between the first conductive feature and the contact via.

15. A contact structure comprising:
a first conductive feature in a first dielectric layer;
a second conductive feature aligned with and over the first conductive feature along a vertical direction;
a third conductive feature over the second conductive feature, the third conductive feature comprising a top surface and the top surface comprising a top width along a direction; and
a first insulation layer over the first dielectric layer, the second conductive feature, and the third conductive feature; and
a fourth conductive feature disposed on the third conductive feature, the fourth conductive feature comprising a bottom surface and the bottom surface comprising a bottom width along the direction,
wherein the second conductive feature comprises a first barrier layer and a first metal layer over the first barrier layer,
wherein the second conductive feature comprises ruthenium, cobalt, iridium, or rhodium and is free of copper,
wherein the third conductive feature comprises a second barrier layer and a second metal layer over the second barrier layer,
wherein the top surface of the third conductive feature is coterminous with the bottom surface of the fourth conductive feature along the direction such that the top width is substantially identical to the bottom width,
wherein the second conductive feature comprises a first height along the vertical direction and the third conductive feature comprises a second height along the vertical direction,
wherein a ratio of the first height to the second height is between about 2:1 and about 4:1.

16. The contact structure of claim 15,
wherein the first barrier layer and the second barrier layer comprise a metal nitride,
wherein the first dielectric layer comprises silicon oxide.

17. The contact structure of claim 16,
wherein the second barrier layer is partially sandwiched between the first insulation layer and the second metal layer,
wherein the second barrier layer is in direct contact with the first insulation layer,
wherein the fourth conductive feature is in physical contact with top surfaces of the second barrier layer and the second metal layer.

18. The contact structure of claim 15, further comprising:
a capping layer disposed between the first conductive feature and the second conductive feature,
wherein a composition of the capping layer is different from a composition of the first conductive feature,
wherein the capping layer comprises copper, cobalt, ruthenium, molybdenum, chromium, tungsten, manganese, rhodium, iridium, nickel, palladium, platinum, silver, gold, aluminum, or a combination thereof,
wherein the first conductive feature comprises copper, cobalt, ruthenium, molybdenum, chromium, tungsten, manganese, rhodium, iridium, nickel, palladium, platinum, silver, gold, aluminum, or a combination thereof.

19. The contact structure of claim 15, wherein top edges of the second conductive feature and the third conductive feature are chamfered.

20. The contact structure of claim 15, wherein the second conductive feature and the third conductive feature comprise vertical sidewalls.

* * * * *